United States Patent [19]

Isaak

[11] Patent Number: 5,003,870
[45] Date of Patent: Apr. 2, 1991

[54] ANTISTRETCH SCREEN PRINTING ARRANGEMENT

[75] Inventor: Harlan Isaak, Costa Mesa, Calif.

[73] Assignee: Hughes Aircraft Company, Los Angeles, Calif.

[21] Appl. No.: 396,173

[22] Filed: Aug. 21, 1989

[51] Int. Cl.⁵ .................................................. B05C 17/06
[52] U.S. Cl. ................................ 101/127.1; 101/127; 101/128.4
[58] Field of Search ...................... 101/127, 127.1, 128, 101/128.1, 128.21, 128.4, 129

[56] References Cited

U.S. PATENT DOCUMENTS

| | | | |
|---|---|---|---|
| 2,071,249 | 2/1937 | Cantor | 101/115 |
| 2,305,852 | 12/1942 | Durham | 101/395 |
| 3,010,394 | 11/1961 | Borchers et al. | 101/395 |
| 3,241,519 | 3/1966 | Lloyd | 118/49 |
| 3,276,423 | 10/1966 | Triller | 118/504 |
| 3,769,908 | 11/1973 | Griffin | 101/127 |
| 3,788,217 | 1/1974 | Rabelow | 101/128.1 |
| 4,084,506 | 4/1978 | Nakatani | 101/127 |
| 4,242,401 | 12/1980 | Mitani et al. | 428/201 |
| 4,273,812 | 6/1981 | Tsutsui et al. | 427/248.1 |
| 4,776,271 | 10/1988 | Schlipf et al. | 101/129 |

FOREIGN PATENT DOCUMENTS 122792  4/1987  Japan .................................. 101/127

*Primary Examiner*—Edgar S. Burr
*Assistant Examiner*—Joseph R. Keating
*Attorney, Agent, or Firm*—Terje Gudmestad; Jeannette M. Walder; W. K. Denson-Low

[57] ABSTRACT

A screen printing arrangement is disclosed including a mesh or screen attached to a frame, the screen having a pattern area defined therein. Strips of thin rectangularly shaped material are glued to the bottom surface of the screen, outside the pattern area. During the screen printing process, the strips keep the screen mesh and pattern from undesirably stretching. Fine conductor lines or conductor line spacings on the order of 5 mils may be achieved.

17 Claims, 2 Drawing Sheets

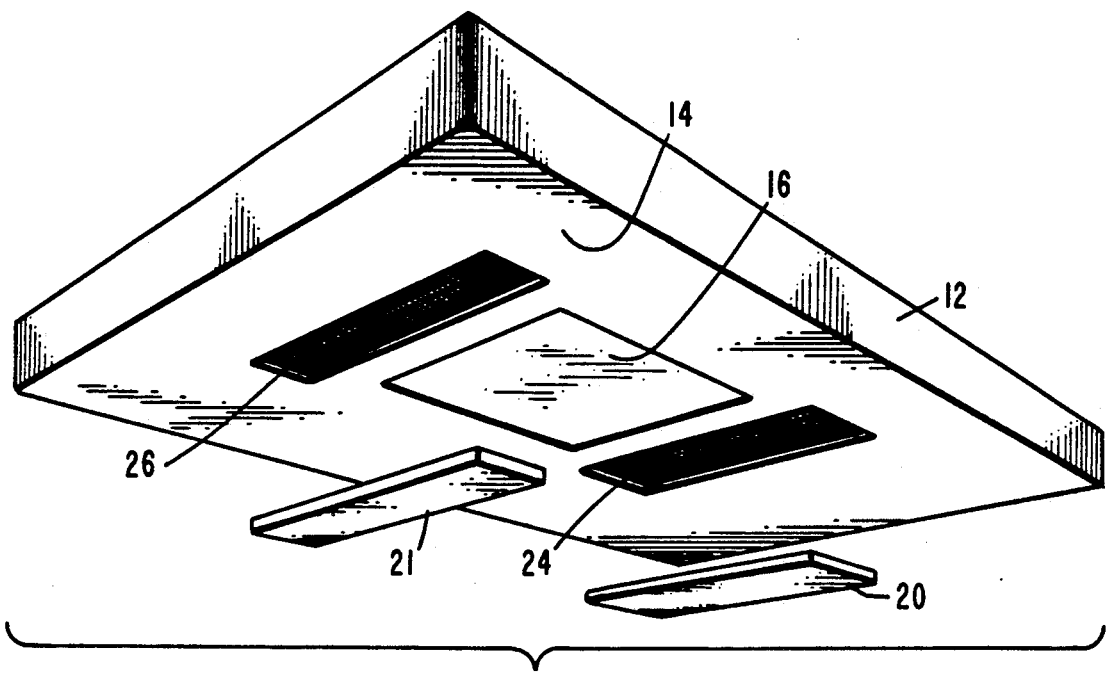
Fig. 1.
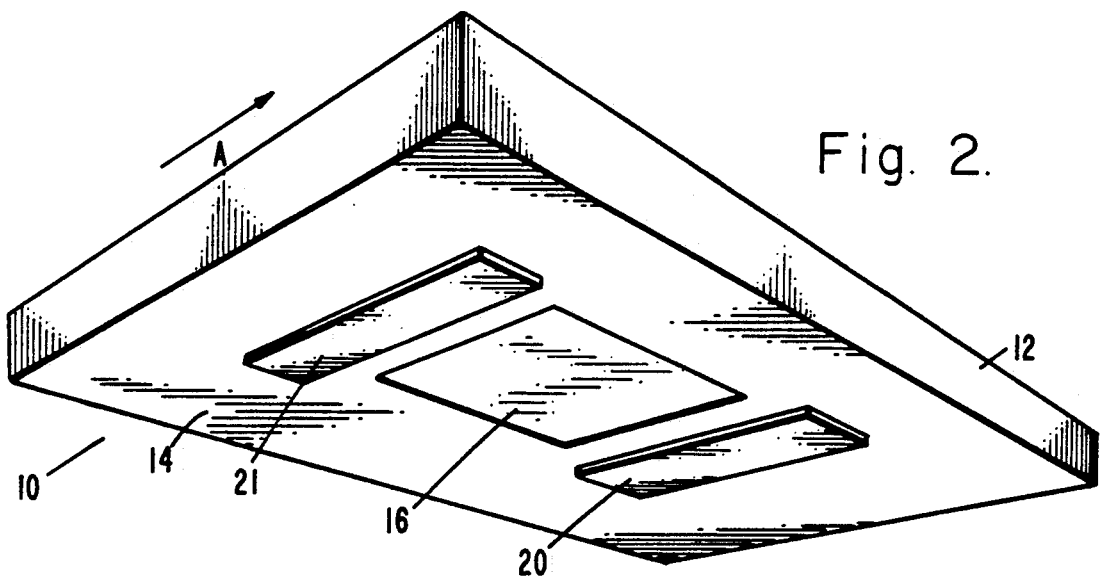
Fig. 2.
Fig. 3.
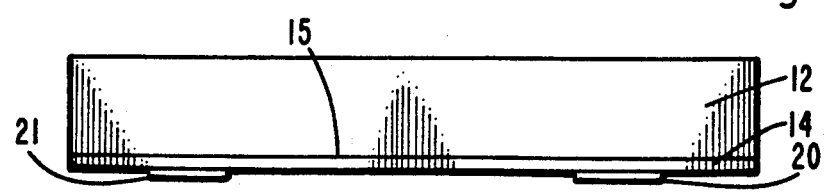

ANTISTRETCH SCREEN PRINTING ARRANGEMENT

BACKGROUND OF THE INVENTION

1. Field of the Invention

The invention relates generally to screen printing of thin and thick film circuitry and more particularly to a stretch resistant screen printing arrangement.

2. Description of Related Art

Conventional screen printing apparatus include a wire mesh layer which is coated with photosensitive emulsion. In the wire mesh, rectangular or circular openings are formed by removing selected portions of the emulsion in a patterned opening portion of the mesh layer through which screen printing paste passes during a screen printing process. The mesh is typically attached to an aluminum frame. A paste of metallic organic or dielectric material is pressed through the pattern openings onto a substrate thereunder by a squeegee, which is moved over the screen.

During the screen printing process, however, the screen may be stretched as a result of the downward and lateral pressure exerted on the screen by the squeegee. Such stretching of the screen can cause distortion in the desired pattern being printed, such as the pattern for conductor lines. Conductor lines may be incomplete or spacing between adjacent conductor lines may be inadequate. Attempts have been made to deal with the screen stretching problem. For example, larger diameter wires have been used for the screen mesh which gives some strength to the screen, but limits the degree to which fine conductor lines can be achieved Screen printing geometric patterns have been adjusted for "light touch" squeegee application to minimize screen stretching. However, some stretching still occurs which limits dimensional accuracy of the printed pattern. Alternatively, nickel foil has been electroplated to a stainless steel mesh. Although this technique limits screen stretch, the pattern art work of the screen must be modified. The expense of fabricating the screen therefore makes this approach an undesirable alternative.

Today electronic circuitry is being made smaller and smaller to meet size and weight requirements desired by both military and commercial customers. Furthermore, as such circuits are used in remote environments reliability is demanded. Accordingly, precise silk screening of nondistorted metallic or dielectric patterns such as conductor lines is desired by the industry. Presently, no screen printing arrangement has been realized to deal with the aforedescribed problems effectively and economically.

SUMMARY OF THE INVENTION

It is therefore an object of the invention to provide a screen printing arrangement that is less susceptible to stretching than those of the prior art and yet is economical to manufacture.

Another object of the present invention is to provide a stretch resistant screen printing arrangement that is simple and easy to fabricate.

It is still a further object of the invention to provide a screen printing arrangement that can provide very thin line elements or very close printed line spacing.

A screen printing arrangement according to the present invention includes a screen mesh with a pattern area defined therein, the screen being affixed to a frame means. Flexible support members or antistretch strips are attached to the back of the screen mesh outside the pattern area. The support members minimize screen stretching as a squeegee is drawn across the screen during a screen printing process.

BRIEF DESCRIPTION OF THE DRAWINGS

FIG. 1 is a partially exploded bottom perspective view of the screen printing arrangement prepared for placement of antistretch strips.

FIG. 2 is a bottom perspective view of the screen printing arrangement with antistretch strips attached thereto in accordance with the invention.

FIG. 3 is a side elevation view of the screen printing arrangement of FIG. 2.

DETAILED DESCRIPTION OF PREFERRED EMBODIMENT

Figure 4:
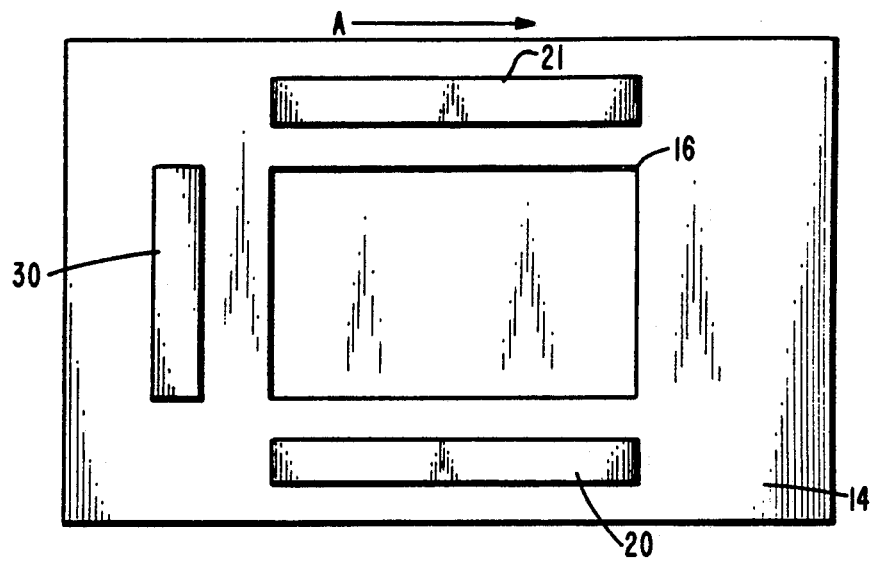
FIG. 4 is a bottom view of another embodiment of the invention.

Referring now with more particularity to FIG. 1 and FIG. 2, wherein like parts are designated by the same numerals throughout the various figures, a screen printing arrangement 10 built in accordance with the principles of the invention includes screen frame 12 which is typically box-shaped. A fine metal or nylon mesh screen 14 is attached to the bottom surface 15 of the frame 12 by epoxy, for example A photosensitive emulsion material covers the entire extent of the screen. The screen 14 has a desired pattern defined therein by exposing predetermined areas of the photosensitive emulsion and washing out these exposed areas with water. Such techniques are well known in the art. The area of the screen wherein the pattern is defined is hereinafter referred to as the pattern area and designated in the drawings by reference numeral 16. The direction defined by reference letter A and the adjacent arrow indicates the direction of travel of a squeegee, during a screen printing process.

At the same time that the desired pattern is defined within the pattern area 16, areas are prepared for placement of two elongated antistretch strips 20 and 21. Using standard processing techniques, two rectangularly shaped areas on the screen are defined by masking and the emulsion thereon exposed. The exposed areas on the screen are washed out, thereby providing screen areas 24 and 26 that the antistretch strips are to be bonded. These screen areas 24 and 26 are preferable located a short distant outside the pattern area 16 and along the direction of travel of the squeegee (not shown) in direction A. The rectangular areas (and antistretch strips) preferably extend a short distance beyond the pattern areas.

Antistretch strips 20 and 22 are attached directly to the screen areas 24 and 26, by bonding, using a flexible adhesive such as low temperature curing epoxy material, for example. The strips may be flat elongated rectangularly shaped strips of nonstretching material, as shown. Alternatively, corrugated strips, square strips or hemisperically shaped strips of material my be used, for example. The flat elongated rectangularly shaped strips 20 and 21 are preferable made of perforated stainless steel or brass, for example, the perforations providing areas for an adhesive to grab. However, the strips may also be made of stiff, hard rubber, for example. The strips may be about 0.005 of an inch in thickness and 0.250 of an inch wide, for example. The strips also preferably should be longer than the pattern area. The adhesive should be flexible such that when it cures, it does not twist or warp the screen. Additionally, the adhesive should not protrude above the surface of the mesh so as to interfere with the squeegee, and the adhesive should not extend below the strip (i.e., on the bottom surface thereof) where the adhesive might effect the surface which is receiving the screen printing material.

With above screen printing arrangement, the antistretch strips will keep the screen from stretching along the direction of the squeegee travel as the squeegee is pulled along the top surface of the screen during a screen printing process. However, the strips are thin so that they will not interfere with the substrate or other surface that is being printed. Finer diameter wires can be used for the screen allowing finer widths and spacing for printed conductor lines to be achieved.

Figure 5:
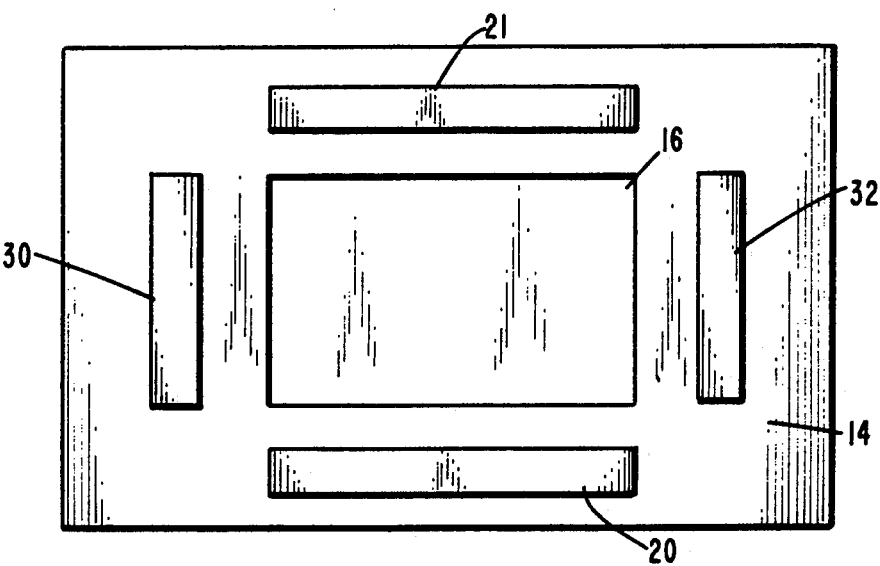
FIG. 5 is a bottom view of another embodiment of the invention.
Figure 6:
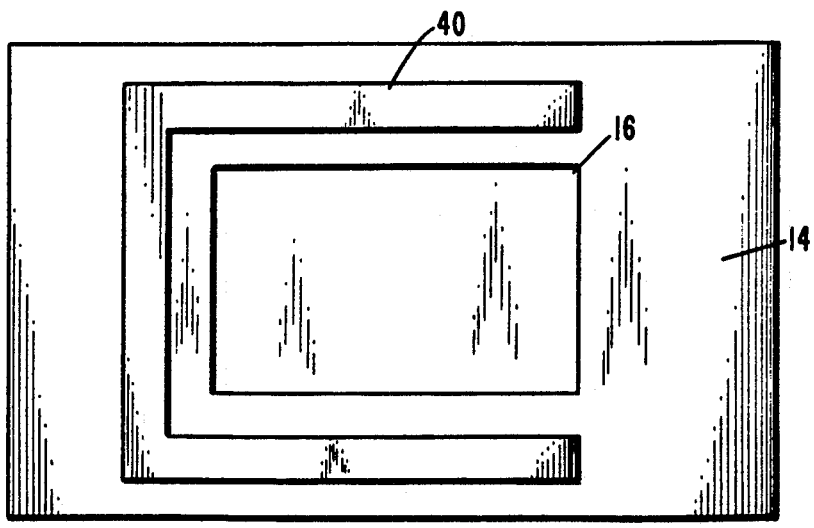
FIG. 6 is a bottom view of still another embodiment of the invention.

A new and improved screen printing arrangement is therefore provided. However, various modifications may be made to the above-described preferred screen printing arrangement without departing from the scope of the invention. For example, although the preferred embodiment has been shown and described with two antistretch strips, fewer or more strips could be employed as desired. For example, an antistretch strip 30 may also be mounted on the screen at either end of the pattern area 16 as shown in FIG. 4, or antistretch strips 30 and 32 may be mounted on both ends of the pattern area 16 as shown in FIG. 5. Alternatively, a single U-shaped antistretch strip 40 straddling the pattern area 16, as shown in FIG. 6, or single box-shaped antistretch strip circumscribing the entire pattern area (not shown) may be employed, for example. Additionally, the size, shape and placement of the antistretch strips may vary.

Accordingly, it should be understood that although the invention has been described and shown for particular embodiments, nevertheless various changes and modifications obvious to a person of ordinary skill in the art to which the invention pertains are deemed to lie within the spirit and scope of the invention as set forth in the following claims.

What is claimed:

1. A screen printing apparatus, comprising:
   frame means;
   a screen mesh attached to said frame means, said screen mesh being coated with a photosensitive emulsion and having a predefined pattern area therein formed by removal of portions of said emulsion for screen printing, said screen mesh having an inner screen surface and an outer screen surface, and
   two flat elongated strips attached to said outer screen surface and located a short distance outside the pattern area and spaced inwardly from said frame means.

2. The silk screen apparatus defined in claim 1 wherein said flat strips are attached to said outer surface by a flexible adhesive.

3. The screen printing apparatus defined in claim 2 wherein said flat elongated strips extend longer than the longitudinal extent of said pattern area.

4. The screen printing apparatus defined in claim 3 wherein said flat strips are perforated metallic material.

5. The screen printing apparatus defined in claim 1 wherein said flat elongated strips are rectangular in shape.

6. A screen printing apparatus for a screen printing process using a squeegee, comprising:
   a frame;
   a screen attached to said framework, said screen comprising a mesh coated with a photosensitive emulsion and having a pattern defined therein by removal of portions or said emulsion; and
   a plurality of strips of material attached to said screen at areas from which portions of said emulsion have been removed and located a short distance outside of and along the pattern in the direction of the squeegee travel and said plurality of strips being spaced inwardly from said frame means.

7. The screen printing apparatus defined in claim 6 wherein said strips are flat elongated metallic members.

8. The screen printing apparatus defined in claim 7 wherein said strips are rectangularly shaped.

9. The screen printing apparatus defined in claim 8 wherein said strips are longer than the longitudinal extent of the pattern area.

10. A screen printing arrangement for dispersing a pattern of screen printing material using a squeegee, comprising:
    frame means;
    a screen attached to said frame means, said screen comprising a mesh coated with a photosensitive emulsion and having a pattern area therein defined by removal of portions of said emulsion; and
    at least one antistretch strip attached to said screen a short distance outside and along the pattern area for limiting stretching of said screen during a silk screen process and said antistretch strip being spaced inwardly from said frame means.

11. The screen printing arrangement defined in claim 10 wherein said at least one antistretch strip is a flat elongated shape of material.

12. The screen printing arrangement defined in claim 11 wherein said flat elongated strip of material is rectangularly shaped.

13. The screen printing arrangement defined in claim 12 including two flat rectangularly shaped elongated strips of material which are attached to said screen outside the pattern area.

14. The screen printing arrangement defined in claim 11 wherein said at least one antistretch strip is attached along the pattern area in the direction of the squeegee travel.

15. The screen printing arrangement defined in claim 14 wherein said at least one antistretch strip is attached to said screen using flexible adhesive.

16. The screen printing arrangement defined in claim 12 including three flat rectangularly shaped elongated strips of material which are attached to said screen outside the pattern area.

17. The screen printing arrangement defined in claim 12 including four flat rectangularly shaped elongated strips of material which are attached to said screen outside the pattern area.

* * * * *